(12) United States Patent
Randazzo et al.

(10) Patent No.: US 6,803,801 B2
(45) Date of Patent: Oct. 12, 2004

(54) CMOS LEVEL SHIFTERS USING NATIVE DEVICES

(75) Inventors: Todd Randazzo, Colorado Springs, CO (US); Scott Savage, Ft. Collins, CO (US); Edson Porter, Colorado Springs, CO (US); Matthew Russell, Burnsville, MN (US); Kenneth Szajda, Holliston, MA (US); Hoang Nguyen, Ft. Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/289,949

(22) Filed: Nov. 7, 2002

(65) Prior Publication Data

US 2004/0090259 A1 May 13, 2004

(51) Int. Cl.[7] ................................................. H03L 5/00
(52) U.S. Cl. ............................. 327/333; 326/63; 326/80
(58) Field of Search ................................. 327/319, 333; 326/62, 63, 80, 82

(56) References Cited

U.S. PATENT DOCUMENTS

| | | | | |
|---|---|---|---|---|
| 5,150,186 A | * | 9/1992 | Pinney et al. ................. | 326/87 |
| 5,467,300 A | * | 11/1995 | Komarek et al. ...... | 365/185.16 |
| 5,508,653 A | * | 4/1996 | Chu et al. ................... | 327/519 |
| 6,025,737 A | * | 2/2000 | Patel et al. .................. | 326/80 |
| 6,285,537 B2 | * | 9/2001 | Allen .......................... | 361/56 |
| 6,366,159 B1 | * | 4/2002 | Taheri ........................ | 327/538 |
| 6,414,534 B1 | * | 7/2002 | Wang et al. ................ | 327/333 |
| 6,534,806 B1 | * | 3/2003 | Wert .......................... | 257/213 |
| 6,559,675 B2 | * | 5/2003 | Koo ............................ | 326/81 |
| 6,614,283 B1 | * | 9/2003 | Wright et al. ............... | 327/333 |
| 2002/0056857 A1 | * | 5/2002 | Iwasa ......................... | 257/203 |
| 2003/0095003 A1 | * | 5/2003 | Li et al. ..................... | 330/253 |

* cited by examiner

Primary Examiner—Terry D. Cunningham
(74) Attorney, Agent, or Firm—Trexler, Bushnell, Giangiorgi & Blackstone, Ltd.

(57) ABSTRACT

A level shifter circuit configured for use between a core of a chip and input/output transistor of the chip in order to shield low voltage devices residing on the core. The level shifter circuit includes voltage tolerant native devices which have VDDCORE on their gates, and each voltage tolerant native device is cascoded with a low voltage transistor on the core.

4 Claims, 5 Drawing Sheets

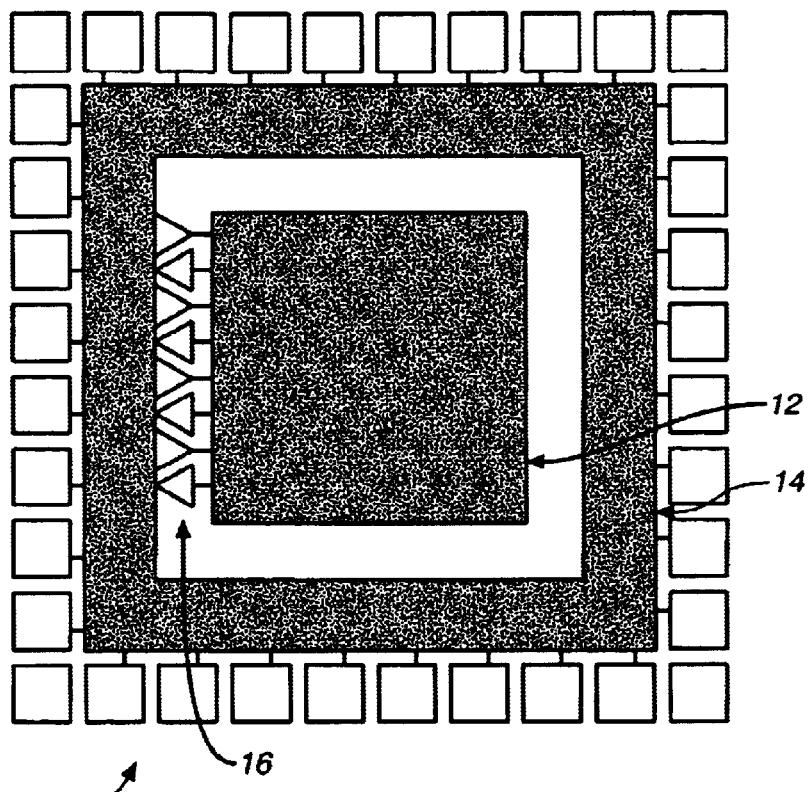
FIG._1 (PRIOR ART)
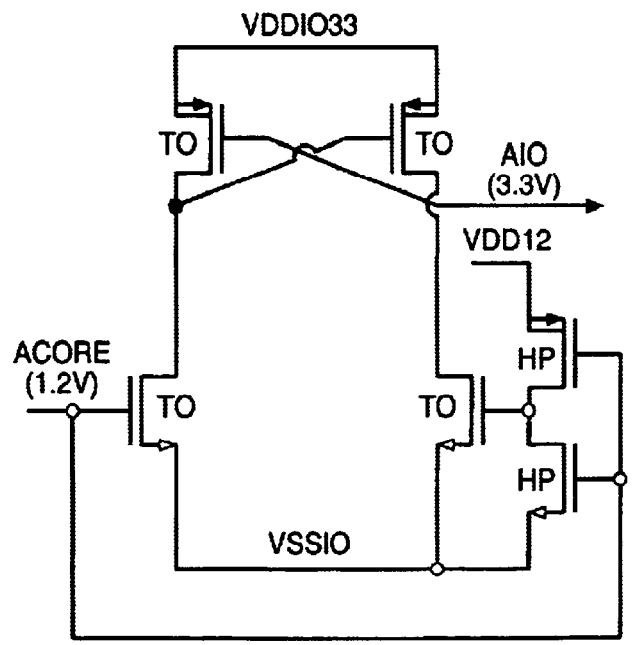
FIG._2 (PRIOR ART)

Signal To Source MOS Level Shifter
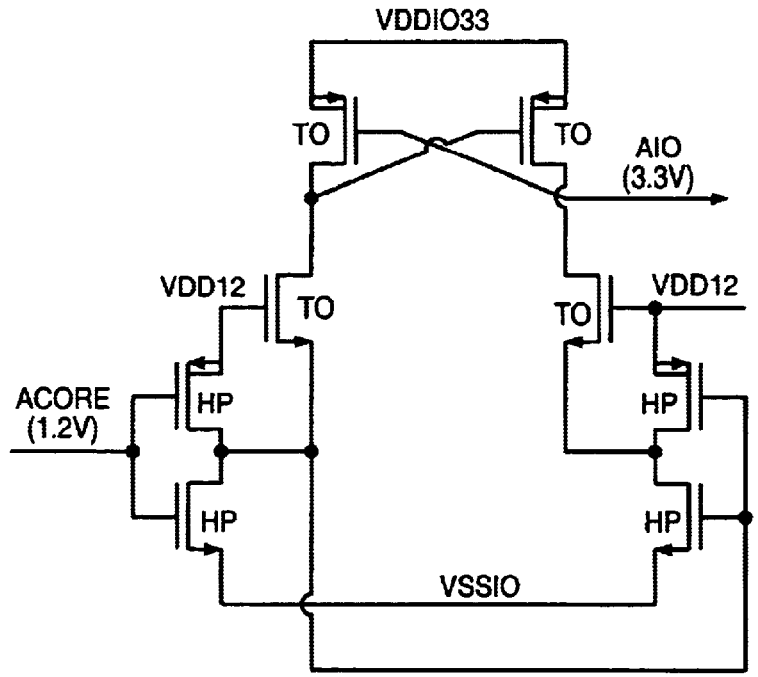
FIG._3 (PRIOR ART)
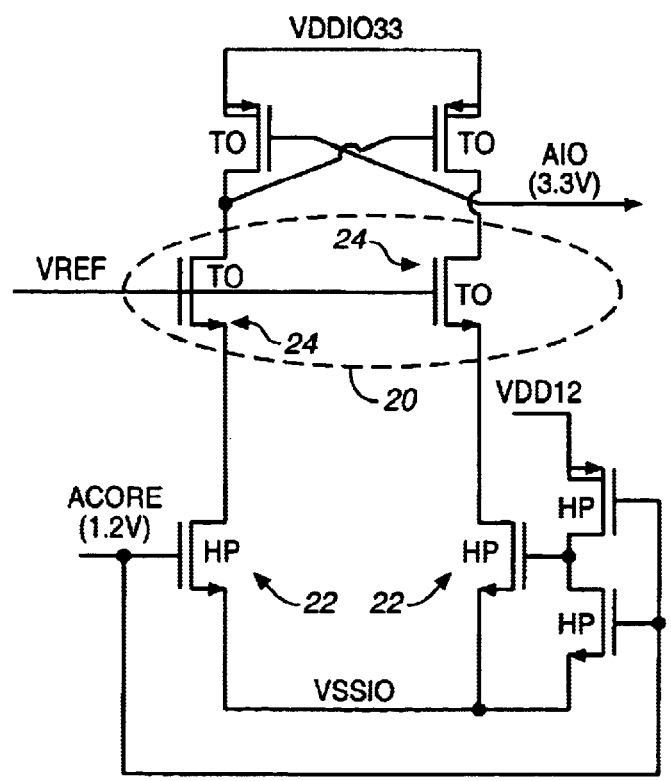
FIG._4 (PRIOR ART)

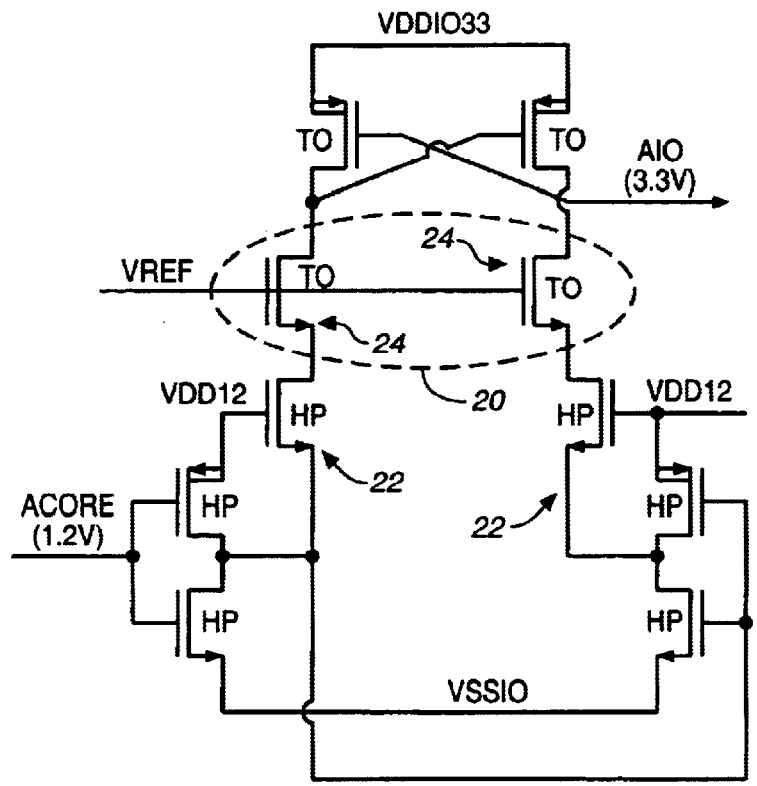
FIG._5 *(PRIOR ART)*
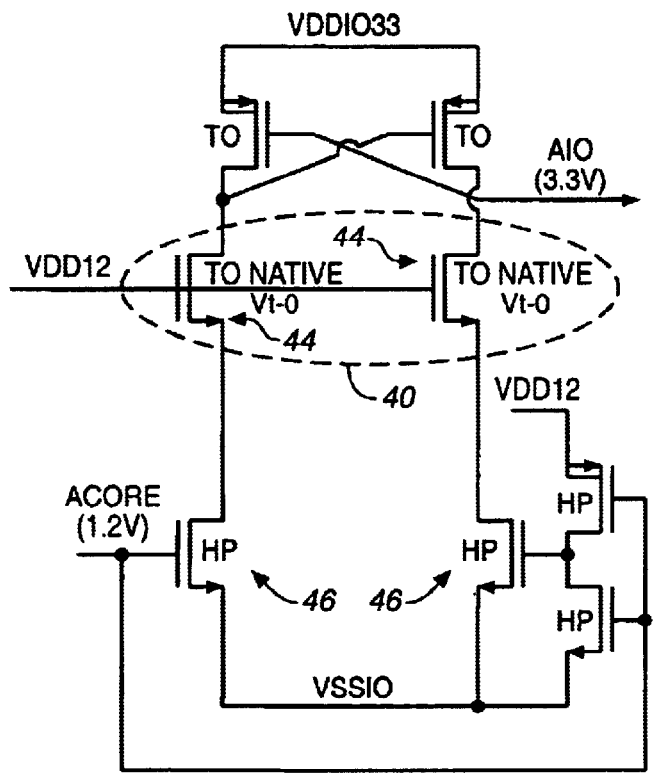
FIG._6

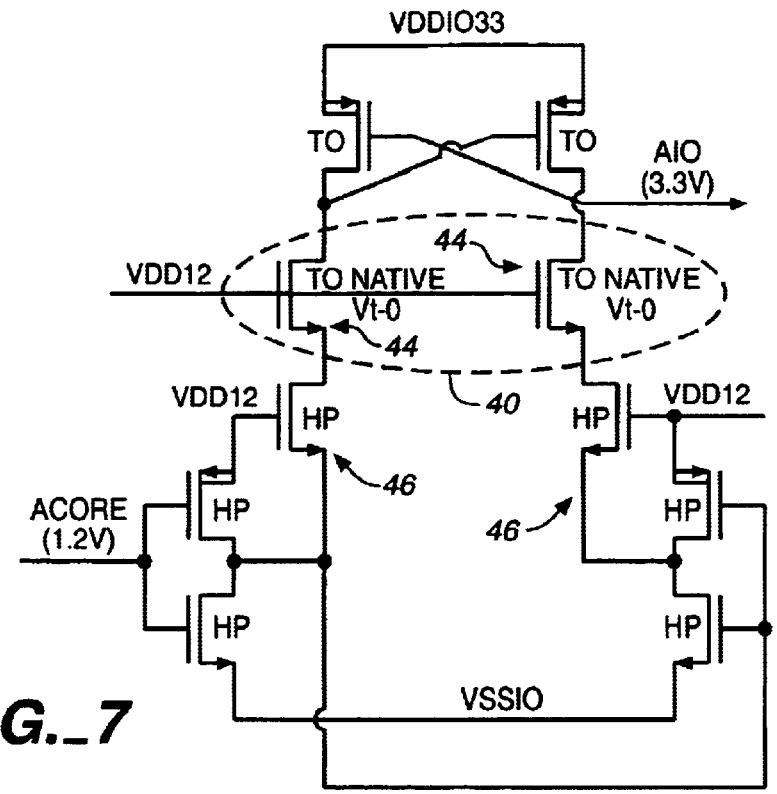
FIG._7
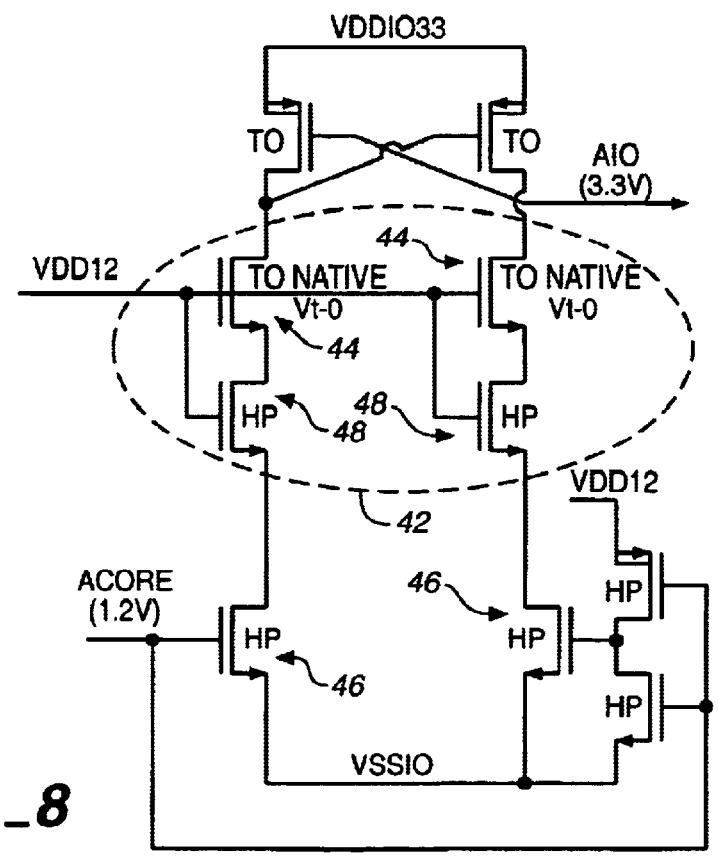
FIG._8

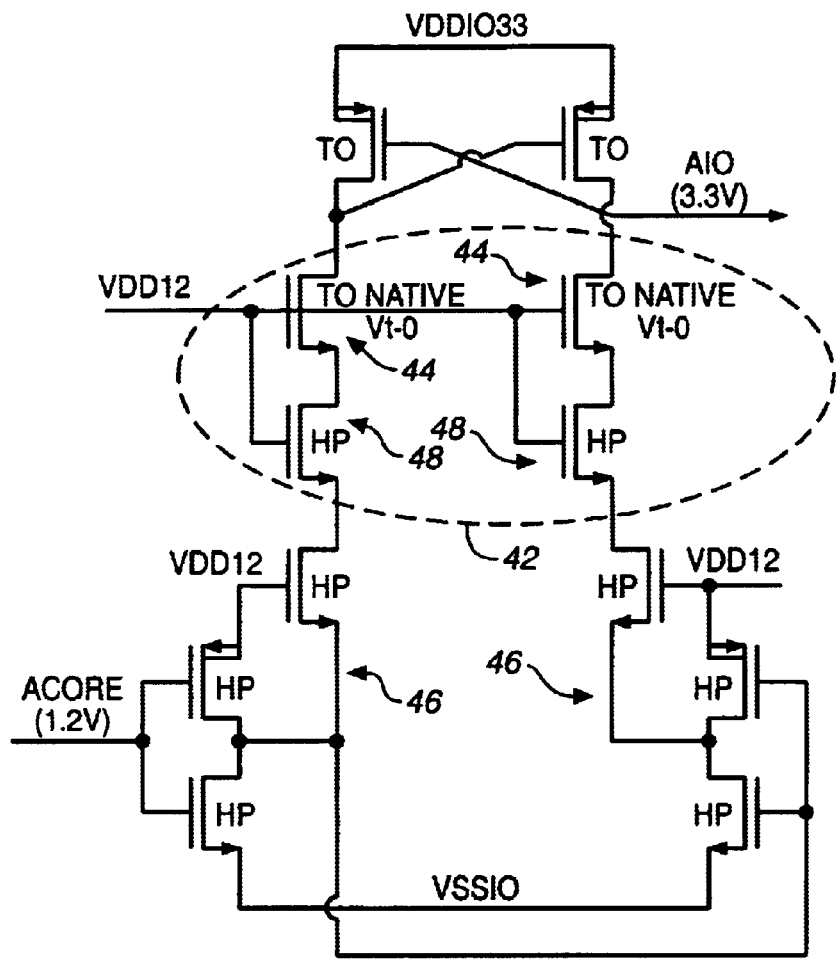
FIG._9

CMOS LEVEL SHIFTERS USING NATIVE DEVICES

BACKGROUND

The present invention generally relates to methods of shielding low voltage devices residing on high voltage domain, and more specifically relates to using native transistors in level shifters in order to shield low voltage devices.

FIG. 1 illustrates a typical Complementary Metal-Oxide Semiconductor (CMOS) integrated circuit or chip 10, wherein an internal core 12 is surrounded by input/output (I/O) transistors 14 (hereinafter the "I/O"). In recent CMOS technologies (i.e., .25UM, .18UM, .13UM), the internal core 12 of a chip 10 operates at a reduced voltage compared to the I/O 14. As a result, the internal core 12 burns less power (CMOS power is proportional to $Vdd^2$), and transistors in the core 12 can be scaled to smaller dimensions. Typically, digital signals in the core 12 (which is most of the chip 10) are at 0 or VDDCORE, while digital signals in the I/O 14 (the smaller portion of the chip 10) are at 0 or VDDIO. As a result of the voltage difference, level shifters 16 are needed between the core 12 and the I/O 14 in order to translate digital signals from one voltage level to the other.

FIGS. 2 and 3 illustrate two traditional level shifter circuits. In FIGS. 2 and 3, "TO" refers to a voltage tolerant ("thick oxide") I/O transistor, while "HP" refers to a low voltage ("high performance") core transistor. While FIG. 2 illustrates a signal-to-gate MOS (Metal-Oxide Semiconductor) level shifter, FIG. 3 illustrates a signal-to-source MOS (Metal-Oxide Semiconductor) level shifter. As shown in both FIGURES, both level shifters provide that VDDCORE (1.2V or 1.0V) is put on the gate of a voltage tolerant device (because that device's drain may go to VDDIO). As core voltages are scaled to 1.2V or even 1.0V or 0.8V, these implementations are becoming very slow, big, and in some cases, simply do not function. Additionally, VDDCORE is getting too close to the voltage threshold of the voltage tolerant device.

FIGS. 4 and 5 illustrate a common proposed solution, wherein FIG. 4 corresponds to FIG. 2, and FIG. 5 corresponds to FIG. 3. As shown, the common proposed solution is to place a voltage regulator network in the circuit, and then use core devices 22 as the switching elements. The voltage regulator network 20 consists of voltage tolerant transistors 24, each having a reference voltage ("VREF") on its gate. The reference voltage is selected to insure that the drain of the switching devices 22 cannot exceed VDDCORE.

The implementation shown in FIGS. 4 and 5 provides some disadvantages. With regard to performance, the back-biased voltage threshold of the regulator transistors 24 varies over temperature, VREF and process. Additionally, the reference voltage, VREF, has a similar variability. All of the variations must be taken into account when designing the circuit, thus nominal performance must be degraded. Furthermore, the reference generator (which generates VREF) draws direct current (DC) power. Hence, in order to avoid routing high voltage signals in the core, a VREF generator must be implemented into every I/O function, and the reference generators consume silicon area. The voltage reference (VREF) must be greater than VDDCORE (i.e., VDDCORE+VTLIN) because the voltage regulator devices 24 have such high voltage thresholds.

OBJECTS AND SUMMARY

A general object of an embodiment of the present invention is to shield low voltage devices residing on high voltage domain.

Another object of an embodiment of the present invention is to use native transistors in level shifters in order to shield low voltage devices residing on high voltage domain.

Still another object of an embodiment of the present invention is to shield low voltage devices residing on high voltage domain without having to use a reference voltage.

Yet another object of an embodiment of the present invention is to shield low voltage devices residing on high voltage domain by using VDDCORE on the gate of a voltage tolerant, native device.

Briefly, and in accordance with at least one of the forgoing objects, an embodiment of the present invention provides a level shifter circuit configured for use between a core of a chip and input/output transistors of the chip in order to shield low voltage devices residing on the core. The level shifter circuit includes voltage tolerant native devices which have VDDCORE on their gates, and each voltage tolerant native device is cascoded with a low voltage transistor on the core.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which:

FIG. 1 is a schematic diagram of a conventional CMOS integrated circuit, wherein an internal core is surrounded by a ring of input/output (I/O) transistors;

FIG. 2 is a schematic diagram of a conventional signal-to-gate MOS level shifter;

FIG. 3 is a schematic diagram of a conventional signal-to-source MOS level shifter;

FIGS. 4 and 5 are schematic diagrams of conventional implementations which correspond to FIGS. 2 and 3, respectively, wherein each of the implementations provides that a voltage regulator device is implemented in the circuit, and core devices are used as the switching elements;

FIGS. 6 and 7 are schematic diagrams of implementations which are in accordance with an embodiment of the present invention; and FIGS. 8 and 9 are implementations similar to that of FIGS. 6 and 7, respectively, but wherein additional drain protection is included.

DESCRIPTION

While the invention may be susceptible to embodiment in different forms, there are shown in the drawings, and herein will be described in detail, specific embodiments with the understanding that the present disclosure is to be considered an exemplification of the principles of the invention, and is not intended to limit the invention to that as illustrated and described herein.

FIGS. 6–9 illustrate level shifter circuit implementations which can be used in association with a chip 10 as shown in FIG. 1 to shield low voltage devices residing on the core 12. Specifically, FIG. 6 corresponds to FIGS. 2 and 4, and illustrates a signal-to-gate MOS level shifter which is in accordance with an embodiment of the present invention and is configured for use between the core of a chip and the I/O of a chip (see FIG. 1). FIG. 7 corresponds to FIGS. 3 and 5, and illustrates a signal-to-source MOS level shifter which is in accordance with an embodiment of the present invention and is configured for use between a core of a chip and the I/O of a chip (see FIG. 1). FIGS. 8 and 9 are similar to FIGS. 6 and 7, respectively, but include additional drain protection.

As shown in FIGS. 6–9, each of the implementations includes a regulator network 40, 42, and each regulator network 40, 42 includes voltage tolerant native devices or transistors 44. Each of the devices 44 has a gate, and instead of having a reference voltage on the gate (as shown in FIGS. 4 and 5), VDDCORE ("VDD12") is on the gates of the voltage tolerant native devices 44. Each of the voltage tolerant native devices 44 is cascoded with one or more high performance, low voltage transistors 46 on the core 12 (see FIG. 1). Preferably, each of the voltage tolerant native devices 44 comprises a low voltage tolerant NMOS device. The voltage tolerant native devices shield low voltage devices which reside on the high voltage power domain (i.e., core) of a chip (see FIG. 1).

Preferably, each of the voltage tolerant native devices 44 has a short gate length, has a nearly zero threshold voltage, and is relatively fast (i.e., Ldrawn~.30 to 1.0). The level shifters shown in FIGS. 6–9 are configured to shift voltages from low voltage core CMOS levels to high voltage I/O CMOS levels.

In the circuits shown in FIGS. 6 and 7, the drain voltage of the switching element 46 can go slightly above VDDCORE. The drain voltage will rise until the subthreshold current through the regulator device 44 equals the sub-threshold current through the switching device 46. Most MOS devices are slightly more drain voltage tolerant than gate voltage tolerant, so this should not be problem. However, if in a given technology it is a problem, as shown in FIGS. 8 and 9, the voltage tolerant native devices 44 can be, cascoded with a high performance, low voltage transistor 48, thus limiting the voltage exposure on both high performance, low voltage transistors 46 and 48. In this case, as shown in FIGS. 8 and 9, the voltage tolerant native devices 44 are connected in series to the high performance, low voltage transistors 48.

The implementations illustrated in FIGS. 6–9 provide that no voltage reference (VREF) generation circuit required, and this saves area and power. Additionally, there are no potential sues with regard to the instability in a reference voltage (i.e., VREF), such as due to model inaccuracy, temperature, VDD drift, and variations in the voltage threshold of the regulator devices 44. Additionally, there is no need to design around reference and voltage threshold tolerances.

While embodiments of the present invention are shown and described, it is envisioned that those skilled in the art may devise various modifications of the present invention without departing from the spirit and scope of the appended claims.

What is claimed is:

1. A chip comprising: a core; input/output transistors; and at least one level shifter circuit between said core and said input/output transistors said Core connected to said level shifter circuit said level shifter circuit connected to said input/output transistors, said level shifter circuit configured to shield low voltage devices residing on said core, said core receiving a core voltage input, said level shifter circuit comprising: at least one voltage input which receives said core voltage input; a plurality of voltage tolerant native devices connected to said voltage input wherein each of said voltage tolerant native devices has a gate which receives said core voltage input, each of said voltage tolerant native devices cascaded with a transistor which provides an output which has a higher voltage level than said core voltage input.

2. A chip as defined in claim 1, wherein said voltage tolerant native devices are comprised of NMOS (N-channel Metal-Oxide Semiconductor) devices.

3. A chip as defined in claim 1, wherein each of said voltage tolerant native devices has a threshold voltage which is near zero.

4. A chip as defined in claim 1, wherein said level shifter circuit is configured to shift voltages from low voltage core CMOS levels to high voltage I/O CMOS levels.

* * * * *